United States Patent
Cruz-Albrecht

(10) Patent No.: US 6,404,260 B1
(45) Date of Patent: Jun. 11, 2002

(54) METHOD AND APPARATUS FOR USING A NON-PERIODIC SIGNAL TO PERFORM CLOCK DITHERING

(75) Inventor: Jose M. Cruz-Albrecht, Palo Alto, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/783,800
(22) Filed: Feb. 13, 2001
(51) Int. Cl.[7] ............................................... G06F 1/04
(52) U.S. Cl. ................................... 327/299; 327/218
(58) Field of Search .............................. 327/200, 211, 327/212, 218, 298, 299; 375/354–376

(56) References Cited

U.S. PATENT DOCUMENTS

| | | | | |
|---|---|---|---|---|
| 4,270,220 A | * | 5/1981 | Hagiwara et al. | 455/182.1 |
| 5,231,319 A | * | 7/1993 | Crafts et al. | 327/277 |
| 5,727,038 A | * | 3/1998 | May et al. | 375/376 |
| 5,923,676 A | * | 7/1999 | Sunter et al. | 714/733 |
| 6,259,754 B1 | * | 7/2001 | Jeong | 375/375 |

OTHER PUBLICATIONS

Publication entitled "Dual–Loop Spread–Spectrum Clock Generator," by Hung–Sung Li, et al., International Solid– State Circuits Conference, , Session 10, Paper TA 10.5, Feb. 16, 1999.

Publication entitled "Sights and Sounds of Chaos," by Leon O. Chua, et al . . . , Jan. 1998.

* cited by examiner

Primary Examiner—Kenneth B. Wells
Assistant Examiner—Cassandra Cox
(74) Attorney, Agent, or Firm—Park, Vaughan & Fleming LLP

(57) ABSTRACT

One embodiment of the present invention provides a system that uses a non-periodic signal to modulate the period of a clock signal. The system includes a latch with a latch input, a latch output and a clock input. Asserting the clock input of the latch causes a data value at the latch input to be stored into the latch, and to thereby appear at the latch output. The system also includes an inverting delay circuit that receives the clock signal from the latch output and generates an inverted and delayed clock signal, which feeds back into the input of the latch. The clock input of the latch is coupled to the non-periodic signal, so that the non-periodic signal is used to latch the inverted and delayed clock signal, so that the clock signal changes at a non-periodic interval. In one embodiment of the present invention, the inverting delay circuit includes a chain of an odd number of inverters. One embodiment of the present invention additionally includes a chaotic circuit containing three or more energy storage elements for generating the non-periodic signal.

18 Claims, 5 Drawing Sheets

METHOD AND APPARATUS FOR USING A NON-PERIODIC SIGNAL TO PERFORM CLOCK DITHERING

BACKGROUND

1. Field of the Invention

The present invention relates to generating a clock signal within a semiconductor chip. More specifically, the present invention relates to a method and an apparatus that uses a non-periodic signal to modulate the period of a clock signal in order to reduce the size of spikes of electromagnetic radiation generated by a circuit that uses the clock signal.

2. Related Art

Most semiconductor chips, including microprocessor chips, make use of an internal clock signal to synchronize various clocked circuit elements. This internal clock signal is typically generated by a clock synthesizer circuit that produces a periodic clock signal, which propagates through a clock distribution network to the various clocked circuit elements.

For example, FIG. 1 illustrates a clock synthesizer circuit located on a semiconductor chip 100. This clock synthesizer circuit receives a signal from an external clock 102, and multiplies the frequency of this signal to produce a clock signal 107, which is distributed through clock distribution network 110 to various clocked circuit elements within semiconductor chip 100. This clock synthesis circuit is comprised of a number of sub-circuits, including divider circuit 112, phase detector circuit 104, filter 106 and voltage-controlled oscillator (VCO) 108.

Divider circuit 112 receives feedback signal 105 as an input, and divides the frequency of feedback signal 105 by an integer value to produce an output signal 103 that feeds into phase detector circuit 104. This integer value specifies a multiplicative relationship between the signal from external clock 102 and output clock signal 107. For example, if the signal from external clock 102 has a frequency of 400 megaHertz, and divider circuit 112 divides by the integer 5, the frequency of output clock signal 107 is 5×400 megaHertz=2 gigaHertz. Note that divider circuit 112 may be programmed to use different integer divisor values.

Phase detector circuit 104 compares the output of divider circuit 112 against the signal from external clock 102 and produces a voltage that feeds through filter 106 into VCO 108. This voltage varies as a function of a difference in phase between signal from external clock 102 and the output of divider circuit 112.

Filter 106 includes a low pass filter to filter out high frequency components from the output of phase detector circuit 104.

VCO 108 uses the output of filter 106 to control the frequency of output clock signal 107. Note that the signal from external clock 102 and feedback signal 105 are used to control the frequency of output clock signal 107 through a classic phase-locked loop arrangement.

This periodic clock signal triggers periodic transitions in the clocked circuit elements. These transitions typically occur on clock edges (see FIG. 2), and produce electromagnetic (EM) radiation, which is concentrated in spikes located in specific frequencies. For example, in a periodic signal, these spikes are located at the frequency of the clock signal, and at the various harmonics of the clock signal (see FIG. 3).

As computer designers pack larger amounts of circuitry into a single semiconductor chip, the number of clocked components in the chip increases, and the total electromagnetic radiation generated by the chip (at the clock frequency) increases.

In larger chips, such as newer microprocessors, electromagnetic radiation can produce detrimental interference in nearby electrical components. This problem is becoming progressively worse as the number of components that can be integrated into a semiconductor chip continues to increase at an exponential rate.

In order to remedy this problem, a clock synthesizer has been proposed to change the time interval between successive transitions of the clock signal, by using a second lower-frequency signal to modulate the frequency of the clock signal (see "Dual Loop Spread Spectrum Clock Generator," by Hung-Sung Li, Yu-Chi Cheng and Deepraj Puar, Digest of Technical Papers of the 1999 IEEE International Solid-State Conference, pp. 184–185.) Under this scheme, the clock signal repeats itself after a large number of clock cycles, instead of a single cycle.

Even though this scheme can reduce the size of the EM spikes, the signal is still periodic in the time domain. Consequently, there still exists clearly defined EM spikes at specific frequencies.

What is needed is a method and an apparatus for generating a clock signal that does not create sharp EM spikes at specific frequencies.

SUMMARY

One embodiment of the present invention provides a system that uses a non-periodic signal to modulate the period of a clock signal. The system includes a latch with a latch input, a latch output and a clock input. Asserting the clock input of the latch causes a data value at the latch input to be stored into the latch, and to thereby appear at the latch output. The system also includes an inverting delay circuit that receives the clock signal from the latch output and generates an inverted and delayed clock signal, which feeds back into the input of the latch. The clock input of the latch is coupled to the non-periodic signal, so that the non-periodic signal is used to latch the inverted and delayed clock signal, so that the clock signal changes at a non-periodic interval.

In one embodiment of the present invention, the inverting delay circuit includes a chain of an odd number of inverters.

One embodiment of the present invention additionally includes a chaotic circuit containing three or more energy storage elements for generating the non-periodic signal. In a variation on this embodiment, the chaotic circuit is made up of a number of components, including: a first resistor with a first end and a second end, a first capacitor coupled between ground and the first end of the first resistor, a first inductor coupled in parallel with a first capacitor, a non-linear resistor coupled between the second end of the first resistor and ground, and a second capacitor coupled in parallel with the non-linear resistor. Note that in one embodiment of the present invention, the first capacitor is a variable capacitor, and the second capacitor is a variable capacitor.

In a variation on this embodiment, an output of the chaotic circuit feeds through a comparator to ensure that the non-periodic clock signal moves from rail to rail.

In a variation on this embodiment, the chaotic circuit includes an adjustment mechanism that can be used to adjust the average period of the non-periodic signal in order to adjust a variance in the period of the clock signal.

In one embodiment of the present invention, the inverting delay circuit includes an adjustment mechanism that can be used to adjust a delay through the inverting delay circuit.

In one embodiment of the present invention, the inverting delay circuit includes a chain of an odd number of inverters, and the adjustment mechanism for the inverting delay circuit includes a variable capacitor coupled between an output of an inverter and ground.

In one embodiment of the present invention, the inverting delay circuit includes a chain of an odd number of inverters, and the adjustment mechanism for the inverting delay circuit includes, a first variable resistor coupled between a voltage source and a drain of a P-type transistor of a first inverter, and a second variable resistor coupled between ground and a drain of a N-type transistor of the first inverter.

One embodiment of the present invention additionally includes a clock distribution network for distributing the clock signal to circuit elements on a semiconductor chip.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Clock Synthesis Circuit

Figure 1:
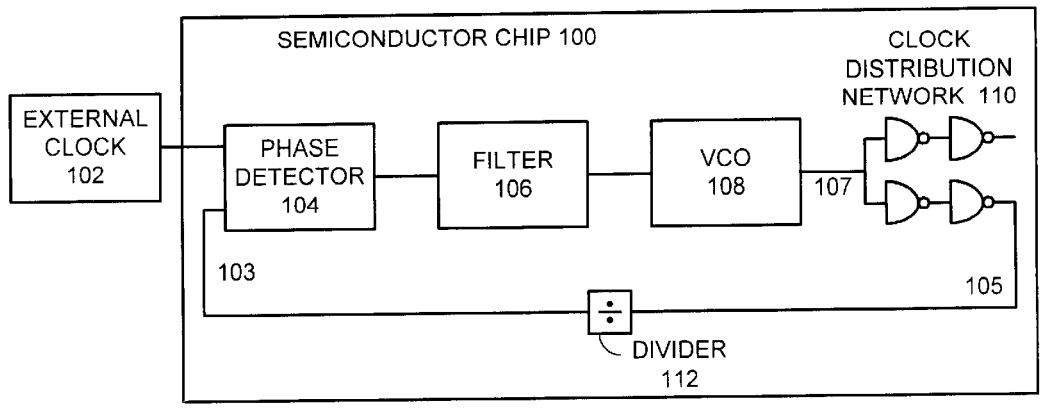
FIG. 1 illustrates a clock synthesis circuit.
Figure 2:
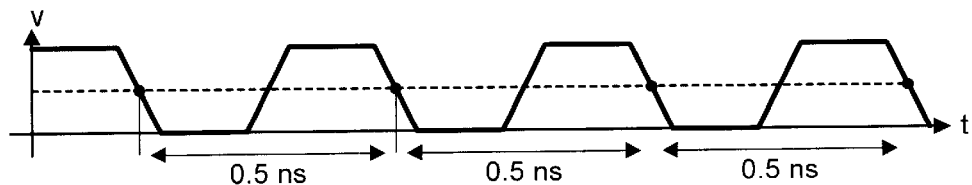
FIG. 2 illustrates the output of the clock synthesis circuit illustrated in FIG. 1.
Figure 3:
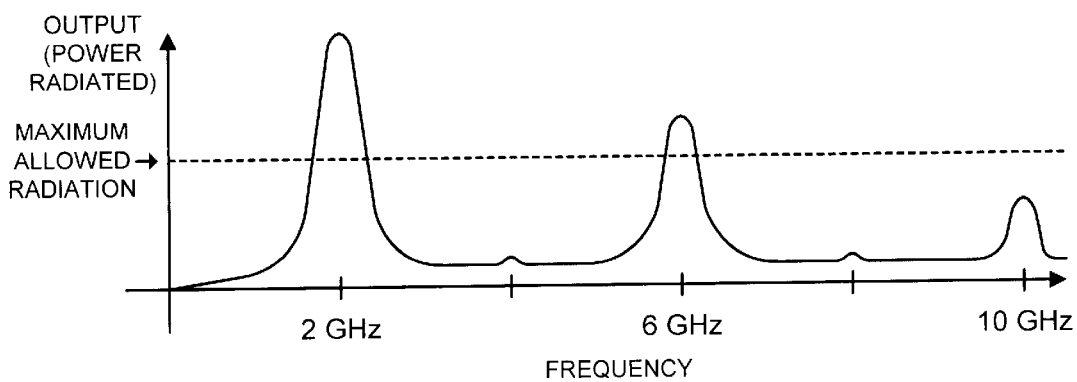
FIG. 3 illustrates spikes of EM radiation generated by a clocked circuit.
Figure 4:
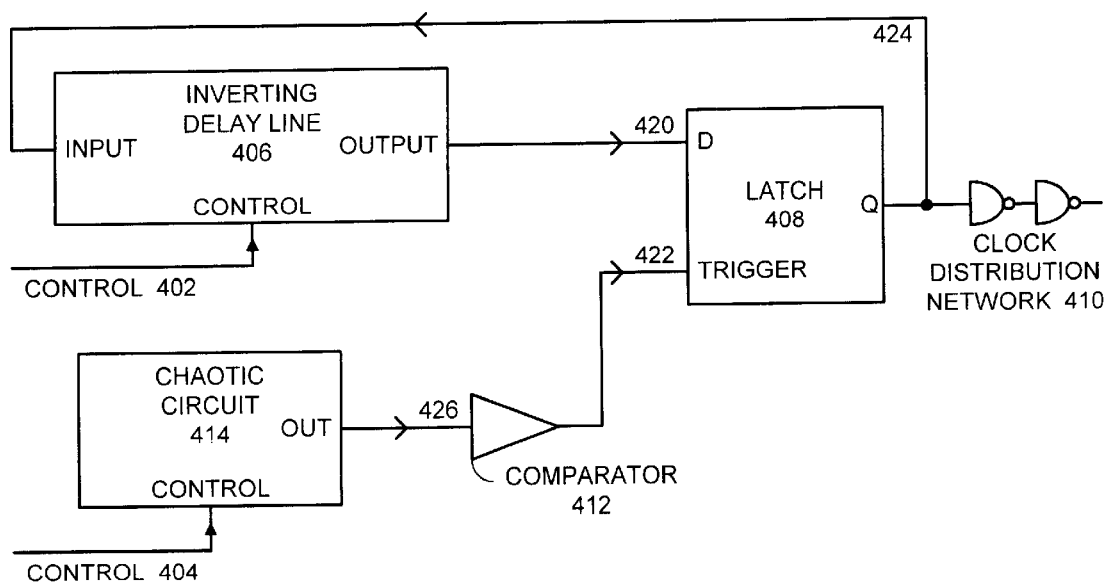
FIG. 4 illustrates a clock synthesis circuit that uses a non-periodic signal to modulate the period of the clock signal in accordance with an embodiment of the present invention.

FIG. 4 illustrates a clock synthesis circuit that uses a non-periodic signal to modulate the period of the clock signal in accordance with an embodiment of the present invention. The clock synthesis circuit illustrated in FIG. 4 includes a number of components, including latch 408, inverting delay line 406, chaotic circuit 414 and comparator 412.

The output "Q" of latch 408 generates a clock signal 424 that feeds through clock distribution network 410 to various clocked components within a synchronous system, such as a microprocessor.

The output of latch 408 additionally feeds through inverting delay line 406 to create an inverted and delayed clock signal 420 that feeds back into the input "D" of latch 408. Note that control signal 402 can be used to control the delay through inverting delay line 406 as is discussed in more detail below with reference to FIGS. 5, 6A and 6B.

Inverted and delayed clock signal 420 is latched into latch 408 by latch signal 422, which feeds into the trigger input of latch 408. In the embodiment of the present invention illustrated in FIG. 4, the trigger input of latch 408 is activated on both the rising edge and the falling edge of latch signal 422.

Latch signal 422 is generated by chaotic circuit that generates an analog chaotic signal 426 that feeds through comparator 412, to create latch signal 422. Note that comparator 412 compares the chaotic signal 426 with a median value for the chaotic signal. If the voltage of chaotic signal 426 is less than the median value, the output of comparator 412 assumes a low voltage. Conversely, if the voltage of chaotic signal 426 is greater than the median value, the output of comparator 412 assumes a high voltage value. Note that the average period of chaotic signal 426 can be varied by varying control signal 404 as is described in more detail below with reference to FIG. 7.

Inverting Delay Line

Figure 5:
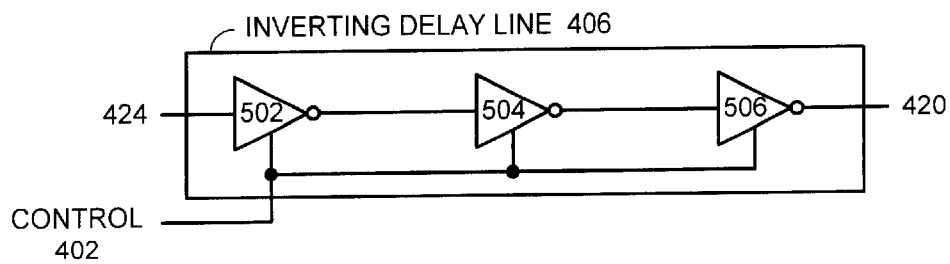
FIG. 5 illustrates the structure of an inverting delay line in accordance with an embodiment of the present invention.

FIG. 5 illustrates the structure of inverting delay line 406 in accordance with an embodiment of the present invention. In this embodiment, inverting delay line 406 includes three inverters 502, 504 and 506, which are chained from input to output to produce inverted and delayed clock signal 420. There is also a control signal 402, which can be used to vary the delay through inverters 502, 504 and 506. Note that in general any odd number of inverters can be used to generate inverted and delayed clock signal 420.

Figure 6A:
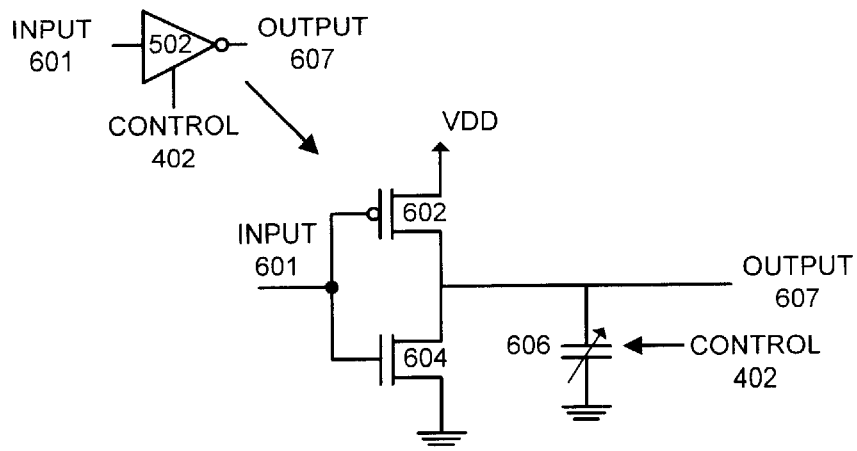
FIG. 6A illustrates how propagation delay through an inverter can be controlled by using a variable capacitor in accordance with an embodiment of the present invention.

FIG. 6A illustrates how propagation delay through an inverter 502 can be controlled by using a variable capacitor in accordance with an embodiment of the present invention. The input 601 to inverter 502 feeds into the gate inputs of P-type transistor 602 and N-type transistor 604. If input 601 assumes a low voltage, P-type transistor 602 turns on, which creates a conducting path between the output 607 of inverter 502 and a high voltage, $V_{DD}$. If the input 601 assumes a high voltage, N-type transistor 604 turns on, which creates a conducting path between the output 607 of inverter 502 and ground.

Output 607 is tied through a voltage-controlled capacitor (varactor) 606 to ground. By varying the capacitance through varactor 606, the speed with which the output 607 changes can be adjusted, and hence, the delay through inverter 502 can be adjusted.

Figure 6B:
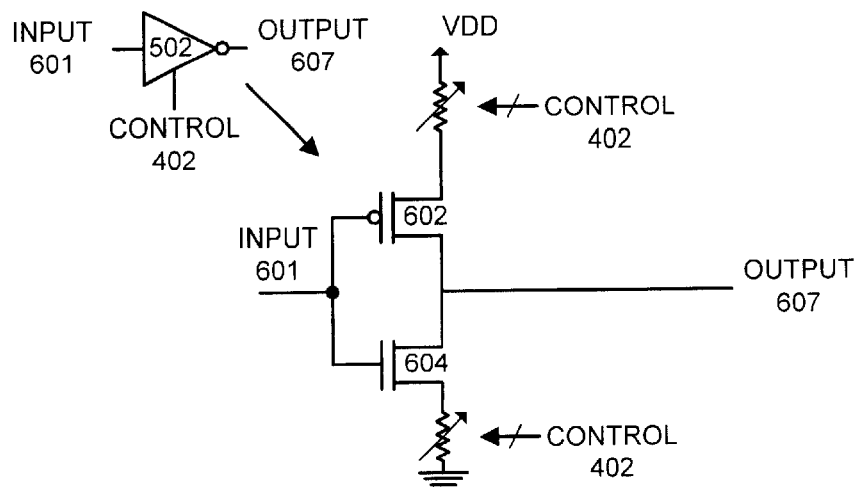
FIG. 6B illustrates how propagation delay through an inverter can be controlled by using variable resistors in accordance with an embodiment of the present invention.

FIG. 6B illustrates how propagation delay through inverter 502 can be controlled by using variable resistors in accordance with an embodiment of the present invention. In this case, the source of P-type transistor 602 feeds through voltage-controlled resistor 608 to $V_{DD}$, and the source of N-type transistor 604 feeds through voltage-controlled resistor 614 to ground. By varying the resistance through voltage-controlled resistors 608 and 614, the speed with which output 607 changes can be adjusted, and hence, the delay through inverter 502 can be adjusted.

Circuit that Generates a Chaotic Signal

Figure 7:
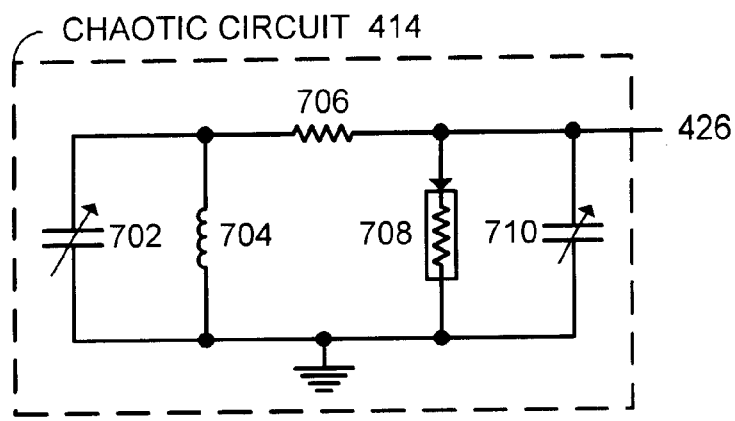
FIG. 7 illustrates a circuit that produces a chaotic signal in accordance with an embodiment of the present invention.

FIG. 7 illustrates a chaotic circuit 414 that produces a chaotic signal 426 in accordance with an embodiment of the present invention. Chaotic circuit 414 includes a number of circuit elements, including voltage-controlled capacitor (varactor) 702, inductor 704, resistor 706, non-linear resistor 708 and varactor 710. The chaotic behavior of the chaotic circuit 414 illustrated in FIG. 7 has been analyzed (see "Sights and Sounds of Chaos," by Leon O. Chua and Rabinder N. Madan, IEEE Circuits and Devices Magazine, January 1988, pp. 3–13.) The chaotic output 426 tends to periodically switch between oscillating around a high voltage value and oscillating around a low voltage value (see waveform 426 in FIG. 9). However, the period between the switches is chaotic, and cannot be predicted beforehand.

Note that the circuit illustrated in FIG. 7 includes three energy storage elements (varactor 702, inductor 704 and varactor 710), which is the minimum number of energy storage elements required to produce a chaotic signal. In one embodiment of the present invention, control signal 404 sets the capacitance value of the varactors. Also note that in general any known circuit that generates a non-periodic signal can be used. Hence, the present invention is not meant to be limited to the circuit illustrated in FIG. 7.

Figure 8:
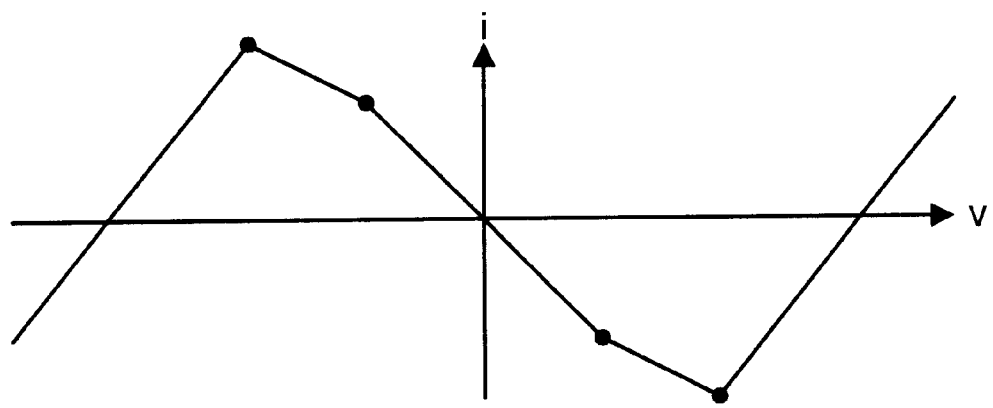
FIG. 8 illustrates the voltage-current characteristic of a non-linear resistor in accordance with an embodiment of the present invention.

FIG. 8 illustrates the voltage-current characteristic of non-linear resistor 708 in accordance with an embodiment of the present invention. Note that nonlinear resistor 708 can be fabricated using two op amps, an op amp and two diodes, or two transistors and two diodes.

Operation of Clock Synthesis Circuit

Figure 9:
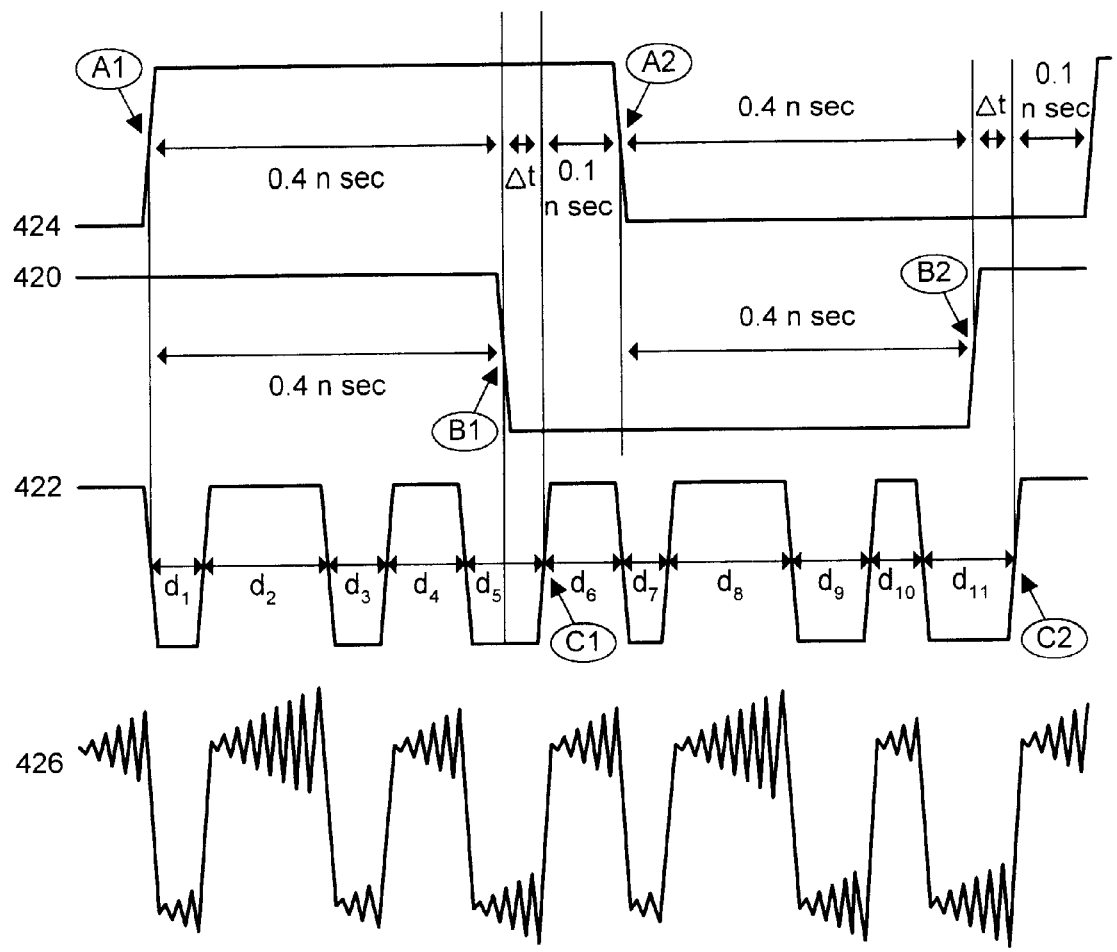
FIG. 9 is a timing diagram illustrating operation of the clock synthesis circuit illustrated in FIG. 4 in accordance with an embodiment of the present invention.

FIG. 9 is a timing diagram illustrating operation of the clock synthesis circuit illustrated in FIG. 4 in accordance with an embodiment of the present invention. Chaotic circuit 414 produces an analog chaotic signal 426 (bottom waveform in FIG. 9), which feeds through comparator 412 to produce a non-periodic latch signal 422 (second to bottom waveform in FIG. 9). Note that each half-cycle has a delay, $d_1$, where the sequence of all delays $\{d_1, d_2, d_3, \ldots\}$ is a non-periodic sequence.

Non-periodic latch signal 422 is used to latch inverted and delayed clock signal 420 into latch 408, which changes clock signal 424 at the output of latch 408. The period of clock signal 424 is determined by several delays. Inverting delay line 406 introduces a delay of 0.4 nanoseconds. Non-periodic latch signal 422 introduces a non-periodic delay, $\Delta t$, that on average is ½ of the average of the half-cycle delays. Finally, latch 408 introduces an additional latch delay of 0.1 nanoseconds. Note that the non-periodic delay, $\Delta t$, causes the period of clock signal 424 to vary in a non-periodic fashion.

More specifically, the first event, A1, is an initial transition from low to high voltage for clock signal 424, which is caused by a falling edge of latch signal 422. This change propagates through inverting delay line 406 and arrives at the input to latch 408 0.4 nanoseconds later (event B1). At this point, the input and the output of latch 408 have opposite values.

At a later time, a subsequent transition on latch signal 422 (event C1), causes the new value to be latched into latch 408. After a 0.1 nanosecond latch delay, the output of latch 408 changes, and hence clock signal 424 changes (event A2). This starts the next half of the processor clock cycle, which moves the clock signal 424 from a low voltage to a high voltage in similar fashion.

Note that the sequence of time delays for successive half-cycles is a non-periodic sequence, which reduces the size of spikes of EM radiation. Also note that the minimum half-cycle interval and the average half-cycle interval can be adjusted by varying control signals 402 and 404.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for using a non-periodic signal to modulate the period of a clock signal, comprising:

receiving the clock signal from an output of a latch;

inverting and delaying the clock signal to produce an inverted and delayed clock signal;

feeding the inverted and delayed clock signal into an input of the latch;

generating the non-periodic signal by using a chaotic circuit containing three or more energy storage elements; and using the non-periodic signal to latch the inverted and delayed clock signal in order to change the clock signal at the output of the latch at a non-periodic interval.

2. The method of claim 1, wherein inverting and delaying the clock signal involves feeding the clock signal through a chain including an odd number of inverters.

3. The method of claim 1, wherein generating the non-periodic clock signal involves feeding an output of the chaotic circuit through a comparator to ensure that the non-periodic clock signal moves from rail to rail.

4. The method of claim 1, further comprising adjusting a delay that is used to produce the inverted and delayed clock signal in order to adjust an average cycle time of the clock signal.

5. The method of claim 1, further comprising adjusting the average period of the non-periodic signal in order to adjust a variance in the period of the clock signal.

6. The method of claim 1, further comprising feeding the clock signal into a clock distribution network in order to couple the clock signal to circuit elements on a semiconductor chip.

7. An apparatus that uses a non-periodic signal to modulate the period of a clock signal, comprising:

a latch including an input, an output and a clock input, wherein asserting the clock input causes a data value at the input to be stored into the latch, and to thereby appear at the output of the latch;

a chaotic circuit containing three or more energy storage elements for generating the non-periodic signal; and an inverting delay circuit that receives the clock signal from the output of the latch and generates an inverted and delayed clock signal;

wherein the inverted and delayed clock signal feeds into the input of the latch;

wherein the clock input of the latch is coupled to the non-periodic signal, so that the non-periodic signal is used to latch the inverted and delayed clock signal, whereby the clock signal changes at a non-periodic interval.

8. The apparatus of claim 7, wherein the inverting delay circuit includes a chain of an odd number of inverters.

9. The apparatus of claim 7, wherein an output of the chaotic circuit feeds through a comparator to ensure that the non-periodic clock signal moves from rail to rail.

10. The apparatus of claim 7, wherein the chaotic circuit includes an adjustment mechanism that can be used to adjust the average period of the non-periodic signal in order to adjust a variance in the period of the clock signal.

11. The apparatus of claim 7, wherein the chaotic circuit includes:

a first resistor with a first end and a second end;

a first capacitor coupled between ground and the first end of the first resistor;

a first inductor coupled in parallel with a first capacitor;

a non-linear resistor coupled between the second end of the first resistor, and ground; and a second capacitor coupled in parallel with the non-linear resistor.

12. The apparatus of claim 11, wherein the first capacitor is a variable capacitor; and wherein the second capacitor is a variable capacitor.

13. The apparatus of claim 7, further comprising a clock distribution network for distributing the clock signal to circuit elements on a semiconductor chip.

14. The apparatus of claim 7, wherein the inverting delay circuit includes an adjustment mechanism that can be used to adjust a delay through the inverting delay circuit.

15. The apparatus of claim 14, wherein the inverting delay circuit includes a chain of an odd number of inverters; and wherein the adjustment mechanism for the inverting delay circuit includes a variable capacitor coupled between an output of an inverter from the odd number of inverters and ground.

16. The apparatus of claim 14, wherein the inverting delay circuit includes a chain of an odd number of inverters; and wherein the adjustment mechanism for the inverting delay circuit includes, a first variable resistor coupled between a voltage source and a source of a P-type transistor of a first inverter from the odd number of inverters; and a second variable resistor coupled between ground and a source of a N-type transistor of the first inverter.

17. An apparatus that uses a non-periodic signal to modulate the period of a clock signal, comprising:

a chaotic circuit containing three or more energy storage elements for generating the non-periodic signal;

a latch including an input, an output and a clock input, wherein asserting the clock input causes a data value at the input to be stored into the latch, and to thereby appear at the output of the latch; and an inverting delay circuit that receives the clock signal from the output of the latch and generates an inverted and delayed clock signal;

wherein the inverting delay circuit includes a chain of an odd number of inverters;

wherein the inverting delay circuit includes an adjustment mechanism that can be used to adjust a delay through the inverting delay circuit;

wherein the inverted and delayed clock signal feeds into the input of the latch;

wherein the clock input of the latch is coupled to the non-periodic signal, so that the non-periodic signal is used to latch the inverted and delayed clock signal, whereby the clock signal changes at a non-periodic interval.

18. The apparatus of claim 17, wherein the chaotic circuit includes an adjustment mechanism that can be used to adjust the average period of the non-periodic signal in order to adjust a variance in the period of the clock signal.

* * * * *